United States Patent
Lin

(10) Patent No.: US 6,780,730 B2
(45) Date of Patent: Aug. 24, 2004

(54) REDUCTION OF NEGATIVE BIAS TEMPERATURE INSTABILITY IN NARROW WIDTH PMOS USING $F_2$ IMPLANTATION

(75) Inventor: Chuan Lin, Poughquag, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/059,321

(22) Filed: Jan. 31, 2002

(65) Prior Publication Data

US 2003/0143812 A1 Jul. 31, 2003

(51) Int. Cl.$^7$ .................... H01L 21/76; H01L 21/8242; H01L 21/20; H01L 21/425
(52) U.S. Cl. ...................... 438/424; 438/246; 438/389; 438/424; 438/433; 438/527
(58) Field of Search .................. 438/246, 389, 438/424, 433, 527, 430, 435, 524, 243, 244

(56) References Cited

U.S. PATENT DOCUMENTS

| | | | |
|---|---|---|---|
| 4,151,007 A | | 4/1979 | Levinstein et al. |
| 5,106,770 A | * | 4/1992 | Bulat et al. .................. 438/193 |
| 5,291,049 A | | 3/1994 | Morita |
| 5,372,950 A | | 12/1994 | Kim et al. |
| 5,571,734 A | | 11/1996 | Tseng et al. |
| 5,596,218 A | | 1/1997 | Soleimani et al. |
| 5,686,344 A | | 11/1997 | Lee |
| 5,750,435 A | | 5/1998 | Pan |
| 5,753,961 A | * | 5/1998 | Tsuchiaki .................... 257/510 |

(List continued on next page.)

FOREIGN PATENT DOCUMENTS

DE 100 62 494 A 1   5/2002

OTHER PUBLICATIONS

Liu, C.H. et al., "Mechanism and Process Dependence of Negative Bias Temperature Instability (NBTI) for pMOS-FETs with Ultrathin Gate Dielectrics", IEEE, 2001, pp. 861–864.

Hook, et al., The Effects of Fluorine on Parametrics and Reliability in a 0.18–μm 3.5/6.8 nm Dual Gate Oxide CMOS Technology, IEEE Transactions on Electron Devices, vol. 48, No. 7, (Jul. 2001) pp. 1346–1353.

*Primary Examiner*—John F. Niebling
*Assistant Examiner*—Stanetta D. Isaac
(74) *Attorney, Agent, or Firm*—Slater & Matsil, L.L.P.

(57) ABSTRACT

In a process of fabricating a narrow channel width PMOS-FET device, the improvement of affecting reduction of negative bias temperature instability by use of $F_2$ side wall implantation, comprising:

a) forming a shallow trench isolation (STI) region in a substrate;

b) forming a gate on a gate oxide in the substrate;

c) forming a liner layer in said shallow trench isolation region and subjecting the liner layer to oxidation to form a STI liner oxidation layer;

d) implanting $F_2$ into side walls of the STI liner oxidation layer at a large tilted angle in sufficient amounts to affect reduction of negative bias temperature instability after a high density plasma fill of the STI $F_2$ implanted liner oxidation layer; and e) filling the STI $F_2$ implanted structure from step d) with a high density plasma (HDP) fill to affect reduction of negative bias temperature instability.

18 Claims, 1 Drawing Sheet

U.S. PATENT DOCUMENTS

| | | |
|---|---|---|
| 5,811,347 A | 9/1998 | Gardner et al. |
| 5,825,066 A | 10/1998 | Buynoski |
| 5,851,899 A | 12/1998 | Weigand |
| 5,880,007 A | 3/1999 | Varian et al. |
| 5,891,787 A | 4/1999 | Gardner et al. |
| 5,904,538 A * | 5/1999 | Son et al. .................... 438/424 |
| 5,909,622 A | 6/1999 | Kadosh et al. ............... 438/286 |
| 5,912,187 A | 6/1999 | Blasko et al. |
| 5,937,287 A | 8/1999 | Gonzalez |
| 5,943,576 A | 8/1999 | Kapoor ....................... 438/302 |
| 6,001,707 A * | 12/1999 | Lin et al. .................... 438/433 |
| 6,069,062 A | 5/2000 | Downey |
| 6,078,089 A | 6/2000 | Gardner et al. |
| 6,080,629 A | 6/2000 | Gardner et al. ............. 438/301 |
| 6,117,715 A | 9/2000 | Ha .............................. 438/197 |
| 6,140,191 A | 10/2000 | Gardner et al. ............. 438/300 |
| 6,144,086 A | 11/2000 | Brown et al. |
| 6,165,870 A * | 12/2000 | Shim et al. .................. 438/424 |
| 6,174,787 B1 | 1/2001 | Fuller et al. |
| 6,187,643 B1 | 2/2001 | Borland ....................... 438/302 |
| 6,197,691 B1 | 3/2001 | Lee |
| 6,207,532 B1 | 3/2001 | Lin et al. |
| 6,232,641 B1 | 5/2001 | Miyano et al. |
| 6,261,889 B1 | 7/2001 | Ono |
| 6,288,433 B1 | 9/2001 | Akram et al. |
| 6,297,106 B1 | 10/2001 | Pan et al. |
| 6,313,011 B1 | 11/2001 | Nouri |
| 6,333,232 B1 * | 12/2001 | Kunikiyo .................... 438/296 |
| 6,335,251 B2 | 1/2002 | Miyano et al. |
| 6,358,865 B2 | 3/2002 | Pearce et al. |
| 6,472,301 B1 | 10/2002 | Lin et al. |
| 6,544,853 B1 | 4/2003 | Lin |
| 6,576,558 B1 * | 6/2003 | Lin et al. .................... 438/700 |
| 2002/0182826 A1 * | 12/2002 | Cheng et al. ............... 438/433 |

* cited by examiner

REDUCTION OF NEGATIVE BIAS TEMPERATURE INSTABILITY IN NARROW WIDTH PMOS USING $F_2$ IMPLANTATION

BACKGROUND OF THE INVENTION

1. Field of the Invention

The invention relates to a process of producing narrow width PMOSFET (p-metal oxide semiconductor field effect transistor) in a manner so as to affect reduction of negative bias temperature instability (NBTI/NBTS). More particularly, the present invention relates to a process to suppress negative bias temperature instability in narrow channel width PMOS devices by implantation of $F_2$ after STI (shallow trench isolation) liner oxidation and prior to the STI HDP fill.

2. Description of Prior Art

As integrated circuits become more complicated and their function becomes more powerful, the necessary density of transistors in the integrated circuit increases accordingly. The high density of these complex integrated circuits are not easily achieved by decreasing a layout according to device proportions of the integrated circuits. Instead, the device size must be decreased by a design rule and with consideration for potential change in the physical characteristics of the device.

In the case of producing PMOSFET microelectronic devices, negative bias temperature instability (NBTI) is a limiting factor insofar as the reliability of the PMOSFET is concerned. The basic cause of NBTI remains unknown, and knobs sometimes used to reduce NBTI are very limited.

It is known that fluorine can reduce NBTI; however, fluorine is introduced through a $BF_2$ source/drain self aligned implant or a fluorine implant into the poly Si gate. Further, NBTI improves with fluorine dose, and the higher the fluorine dose, the better the improvement in reduction of NBTI up to a certain limit of $F_2$.

Despite the foregoing, device optimization and process compatibility in fact determine the fluorine dose that can be used for NBTI improvement. This being the case, the allowable change of fluorine dose is very limited. Unfortunately, this limit severely restricts the ability to reduce NBTI.

While the prevailing belief is that fluorine at the $Si/SiO_2$ interface improves NBTI reliability, nevertheless, the fluorine is diffused either from the poly Si gate or source/drain in the existing techniques of preparing PMOSFET's. Accordingly, these traditional techniques are not very efficient in introducing fluorine into $Si/SiO_2$ interface.

U.S. Pat. No. 5,909,622 disclose a method for forming a p-channel transistor, comprising:

providing a silicon substrate having a source region and a drain region spaced by a gate conductor;

exposing the drain region, the source region and the gate conductor to a nitrogen and oxygen ambient to form a nitrided oxide;

implanting a first-p-type dopant into the source region and the drain region at an angle within the range between 20° and 70° relative to upper surfaces of the source and drain regions;

depositing a source-side and a drain-side oxide upon the nitrided oxide;

removing the source-side and drain-side oxide except for spacer portions of the source-side and the drain-side oxide adjacent lateral portions of the nitrided oxide, the lateral portions being arranged adjacent opposed sidewall surfaces of the conductor; and implanting a second p-type dopant into areas of the source region and the drain region laterally spaced from the gate conductor by the spacer portions of the source-side and drain-side oxide and the lateral portions of the nitride oxide at an angle perpendicular to upper surfaces of the source and drain regions.

A suitable p-type implant species is $BF_2$.

A method of forming a portion of an MOS transistor that uses angled implant to build MOS transistors in contact holes is disclosed in U.S. Pat. No. 5,943,576. The method entails:

depositing a polysilicon layer over a semiconductor substrate of a first conductivity type;

depositing above the polysilicon layer a dielectric layer and a refractory metal layer;

forming a contact hole through the refractory metal layer, the dielectric layer and the polysilicon layer to expose a portion of the semiconductor substrate;

implanting a dopant at a first angle other than an angle normal to a substrate surface, to form a first source/drain region in the semiconductor substrate under the polysilicon layer on a first side of the contact hole, the first source/drain region having a conductivity type opposite the first conductivity type;

implanting the dopant at a second angle other than an angle normal to the substrate surface, to form a second source/drain region in the semiconductor substrate under the polysilicon layer on an opposite side of the first side of the contact hole, the second source/drain region having a conductivity type opposite the first conductivity type;

removing the refractory metal layer; and forming a gate electrode in the contact hole.

The p-type dopant can be $BF_2$.

U.S. Pat. No. 6,080,629, disclose ion implantation into a gate electrode layer using an implant profile displacement layer. The method of forming the gate electrode for insulated gate field effect transistor (IGFET) comprises:

providing a gate dielectric layer on an underlying semiconductor body;

forming a gate electrode layer on the gate dielectric layer;

forming a displacement layer on the gate electrode layer to form a combined displacement/gate electrode layer;

implanting a first material into the combined displacement/gate electrode layer to form an implant profile of the first material within at least the gate electrode layer; and removing regions of the combined displacement/gate electrode layer to form a gate electrode in remaining regions.

A boron implant step may utilize $BF_2$.

A method of fabricating integrated circuit field effect transistors by performing multiple implants prior to forming the gate insulating layer is disclosed in U.S. Pat. No. 6,117,715. The method entails:

forming a first mask pattern including first openings on a face of an integrated circuit substrate;

implanting ions into the face through the first openings to form buried implants that are remote from the face;

forming a second mask pattern in the first openings;

removing the first mask pattern from the first openings to define second openings on the face of the integrated circuit substrate;

forming surface implants in the integrated circuit substrate, adjacent the face thereof, by implanting ions into the face through the second openings; and forming a gate insulating layer and a gate electrode in the second openings.

The p-type ions may be $BF_2$.

U.S. Pat. No. 6,140,191 disclose a method of making high performance MOSFET with integrated simultaneous formation of source/drain and gate regions, comprising:

forming a first stack on the substrate and a second stack on the substrate in spaced-apart relation to the first stack, the first stack having a first layer and first and second spacers adjacent to the first layer, the second stack having a second layer and third and fourth spacers adjacent to the second layer;

forming a gate dielectric layer on the substrate between the first and second stacks;

forming a first conductor layer on the gate dielectric layer;

forming a first source/drain region beneath the first layer and a second source/drain region beneath the second layer; and removing the first and second layers and forming a first contact on the first source/drain region and a second contact on the second source/drain region.

A p+ implant may be performed using a p-type dopant of $BF_2$.

A simplified semiconductor device manufacturing process using low energy high tilt angle and high energy post-gate ion implantation (POGI) is disclosed in U.S. Pat. No. 6,187,643 B1. The implant parameters suitable for implementing the process includes $BF_2$ as the implant species.

It is known that narrow channel width devices exhibit higher NBTI/NBTS than wider channel devices for the same channel length; however, there is no known solution to this problem. For example, fluorine is known and used to suppress NBTI/NBTS by introducing it through source/drain implantation, by using a $BF_2$ implant. While this technique is good enough for wider channel length devices, it is not good enough for narrow channel width devices. This is in part due to the fact that, as gate oxide thicknesses get thinner, the amount of fluorine introduced through the source/drain implant is not enough for wider channel length devices—let alone narrow channel width devices. Accordingly, there is a need in the art of preparing narrow channel width devices to provide a method for reduction of negative bias temperature instability.

SUMMARY OF THE INVENTION

One object of the present invention is to provide a process to suppress negative bias temperature instability (NBTI/NBTS) in narrow width PMOSFET devices.

Another object of the present invention is to provide a process to suppress negative bias temperature instability in narrow width PMOSFET devices by the use of sidewall fluorine implantation.

A further object of the present invention is to provide a process to suppress negative bias temperature instability in narrow width PMOSFET devices by introducing sidewall fluorine implantation after shallow trench isolation (STI) liner oxidation and before STI HDP fill, by implanting fluorine through the STI liner.

In general, the invention is accomplished by introducing fluorine after STI liner oxidation and before STI HDP fill to suppress NBTI/NBTS and enhance gate oxidation at the STI corner.

BRIEF DESCRIPTION OF THE DRAWINGS

The invention is now described with respect to a specific embodiment thereof and reference will be made to the drawing, in which.

DETAILED DESCRIPTION OF PREFERRED EMBODIMENT OF THE INVENTION

Figure 1:
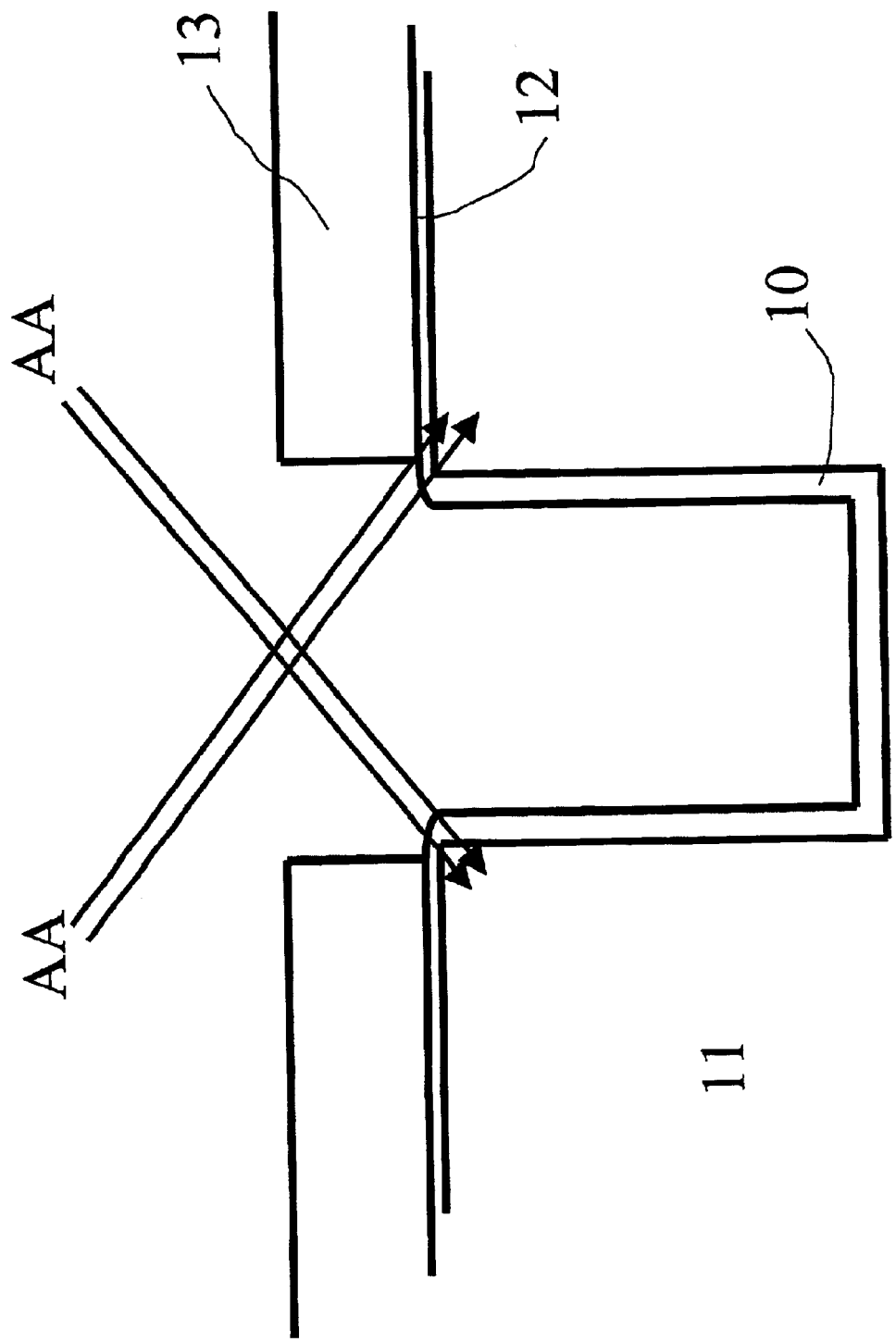
FIG. 1 depicts a narrow width PMOSFET device subjected to sidewall $F_2$ implantation after STI liner oxidation and prior to STI HDP fill.

The fabrication of MOSFET devices are well known. For example, MOSFETs are manufactured by placing an undoped polycrystalline (polysilicon) material over a thin gate oxide, whereupon the polysilicon material and gate oxide are patterned to form a gate conductor with source/drain regions adjacent to and on opposite sides of the gate conductor. Thereafter, the gate conductor and source/drain regions are implanted with an impurity dopant material. In the case where the impurity dopant material used for forming the source/drain regions is n-type the resulting MOSFET is an NMOSFET (n-channel) transistor device. On the other hand, if the source/drain impurity dopant material is p-type, the resulting MOSFET is a PMOSFET (p-channel) transistor device.

The gate conductor and adjacent source/drain regions are produced using well-known photolithography techniques. The gate conductors and source/drain regions generally arise in openings formed through a thick layer known as a field oxide. These openings and the transistors formed therein are referred to as active regions. In other words, the active regions are regions between field oxide regions. A metal interconnect is routed over the field oxide to couple with the polysilicon gate conductor as well as with the source/drain regions to complete formation of an overall circuit structure.

In this art, integrated circuits utilize either n-channel devices or p-channel devices exclusively, or a combination of both on a monolithic substrate. Although both types of devices may be formed, the devices are distinguishable, as mentioned, based upon the source/drain impurity dopant.

Significantly, the process by which an n-type dopant is used to form an n-channel device and p-type dopant is used to form a p-channel device involves unique problems associated with each type device. In each type device, as layout densities increase, unique production problems and characteristic device problems are magnified. Therefore, device failure can occur unless adjustments are made to the processing parameters and processing steps. N-channel processing steps are different from p-channel processing steps due to the unique problems of each type of device.

For example, in the PMOSFET, negative bias temperature instability (NBTI) is a limiting factor in terms of reliability of the structure. The fundamental cause of NBTI remains unknown.

Further, knobs that are used to reduce NBTI are very limited. At present, it is known that fluorine introduced as $BF_2$ through a $BF_2$ source/drain self-aligned implant or into the poly Si gate can reduce NBTI.

During formation of the PMOSFET at the poly-Si/$SiO_2$ interface it has been found that there is a threshold voltage shift $\Delta V_{th}$ and degradation of the device after a negative bias temperature stress, whereas under a plus bias temperature stress, the threshold voltage shift ($\Delta V_{th}$) is negligibly small. The $\Delta V_{th}$ is given by a power law, $\Delta V_{th} \sim t^a$, with $a=\frac{1}{3}$. While not desirous of being bound by a theory, it is believed that the threshold voltage shift during negative bias temperature stress is caused in the Si/$SiO_2$ interfaces rather than in gate insulators.

The $\Delta V_{th}$ during negative bias stress may be written as follows:

$$|\Delta V_{th}|=\Delta V_{tho}\cdot(t/10^4)^a\cdot\exp(-q/kT(\Phi 0-a\cdot E/2))^1.$$

[1] K. O. Jeppson, et al., J. Appl. Phys., 48, 2004 (1977).

Where $\Phi$ is a zero-field activation energy, and $q\cdot a\cdot E$ is an energy gain in oxide field E.

It is known from earlier knowledge that narrow channel width PMOSFET devices suffer more NBTI/NBTS than wider channel width devices for the same channel length. The exact degradation mechanism is still not clear, and there is no known solution to this problem. However, it is known that fluorine has been used to suppress the NBTI/NBTS in previous technologies. The manner in which fluorine is used in these previous technologies is to introduce the fluorine through source/drain implantations using, for example, a $BF_2$ implant. This prior system of using a $BF_2$ implant is good enough for wider channel length devices, but not good enough for narrow channel width devices. This is so because, as gate oxide thicknesses get thinner, the amount of fluorine introduced through the source/drain implant is not enough even for wider channel length devices—let alone narrow channel width devices.

The present invention advances a new procedure to suppress negative bias temperature instability (NBTI/NBTS) in narrow width PMOSFET devices. This new process uses a sidewall fluorine implantation, wherein fluorine is introduced after the STI liner oxidation and prior to the STI HDP fill. The fluorine implantation through the STI liner serves two purposes:

to introduce additional fluorine to suppress the NBTI/NBTS; and to enhance gate oxidation at the STI corner.

Fluorine introduced in this manner helps to reduce NBTI/NBTS in the narrow width device and the thicker gate oxide additionally helps to reduce the NBTI/NBTS due to the fact that the electrical field is lower.

More specifically, the invention is accomplished by:

forming a shallow trench isolation region in a substrate;

forming a gate on a gate oxide in said substrate;

forming a liner layer in said shallow trench isolation region and subjecting said liner layer to oxidation to form a STI liner oxidation layer;

implanting $F_2$ into side walls of the STI liner oxidation layer at a large tilted angle in sufficient amounts to affect reduction of negative bias temperature instability after a high density plasma fill of the STI $F_2$ implanted liner oxidation layer; and filling the STI $F_2$ implanted structure from with a high density plasma (HDP) fill to affect reduction of negative bias temperature instability.

Reference is now made to FIG. 1, which shows a graphic depiction of the $F_2$ sidewall implantation after shallow trench isolation (STI) liner oxidation and before STI HDP fill to reduce NBTI in the narrow width PMOS device. After the liner oxidation layer 10 is formed, $F_2$ sidewall implantation as shown by arrows AA is affected to impinge upon the narrow width PMOS structure, further characterized by a Si substrate 11, a pad oxide 12, and a nitride layer 13. This process does not require extra masks and has no side effects. As can be seen, the fluorine is blanket implanted across the wafer.

It has been found that $F_2$ implanted in this manner also benefits NMOSFET devices by reducing the narrow width effect (narrow width effect is the effect when the threshold voltage gets lower as the channel width gets smaller).

The invention process may be used alone or in combination with prior processes of affecting fluorine implantation using $BF_2$ source/drain implantation to obtain even better NBTI reduction.

Unlike prior processes which have used $BF_2$ implantation in the source/drain region to suppress NBTI, and where reduction of the NBTI is not sufficient for narrow width devices, would require too high a dosage of $BF_2$, and wherein the too high $BF_2$ dose causes gate oxide reliability problems, the present invention reduction of NBTI in narrow width PMOS devices by blanket sidewall $F_2$ implantation requires lower doses of $F_2$.

While the invention has been described with respect to a specific embodiment, it is to be understood that many modifications and changes are possible within the scope of the invention without departing from the spirit of the invention as set for in the appended claims.

What is claimed is:

1. In a process of fabricating a narrow channel width PMOSFET device, the improvement of affecting reduction of negative bias temperature instability by use of $F_2$ side wall implantation, comprising:

a) forming a shallow trench isolation (STI) region in a substrate having a pad oxide and a nitride layer on its surface;

b) forming a liner layer in said shallow trench isolation region and subjecting said liner layer to oxidation to form a STI liner oxidation layer;

c) after forming the STI region and forming the liner layer, implanting $F_2$ into upper top corners of said STI liner oxidation layer at a large tilted angle in sufficient amounts to affect reduction of negative bias temperature instability and enhance gate oxidation at the STI corner after a high density plasma fill of said STI $F_2$ implanted liner oxidation layer; and d) filling the STI $F_2$ implanted structure from step c) with a high density plasma (HDP) fill to affect reduction of negative bias temperature instability and enhance gate oxidation at the STI corner.

2. The process of claim 1 wherein said substrate is Si.

3. The process of claim 2 wherein said liner oxidation layer is $SiO_2$.

4. The process of claim 2 wherein said liner oxidation layer is SiON.

5. The process of claim 3 wherein said large tilted angle is from about 10 to about 30 degrees with reference to the Y axis.

6. The process of claim 4 wherein said large tilted angle is from about 10 to about 30 degrees with reference to the Y axis.

7. The process of claim 5 wherein said sufficient amount of $F_2$ is a dose of from about $5\times10^{12}$ to about $1\times10^{14}$ cm$^2$.

8. The process of claim 6 wherein said sufficient amount of $F_2$ is a dose of from about $5\times10^{12}$ to about $1\times10^{14}$ cm$^2$.

9. The process of claim 7 wherein said high density plasma (HDP) fill is a HDP oxide fill.

10. The process of claim 8 wherein said high density plasma (HDP) fill is a HDP oxide fill.

11. A method of forming a semiconductor structure, the method comprising:

providing a semiconductor substrate;

forming a trench within the semiconductor substrate, the trench including upper top corners;

forming a liner layer in the trench;

after forming the liner layer, implanting fluorine into upper top corners of the trench, the implanting being performed at a large tilted angle; and after implanting fluorine, filling the trench with an insulating material.

12. The method of claim 11 wherein forming a liner layer comprises lining the trench side walls with a oxide layer prior to implanting fluorine.

13. The method of claim 11 wherein providing a semiconductor substrate comprises providing a semiconductor substrate having a pad oxide formed over a portion thereof and a nitride layer formed over the pad oxide.

14. A method of forming a semiconductor structure, the method comprising:

providing a semiconductor substrate;

forming a trench within the semiconductor substrate, the trench including upper top corners;

after forming the trench, implanting fluorine into upper top corners of the trench, the implanting being performed at a large tilted angle; and after implanting fluorine, filling the trench with an insulating material and wherein implanting fluorine comprises implanting fluorine in sufficient amounts to affect reduction of negative bias temperature stability and enhance gate oxidation at the STI corner.

15. The method of claim 11 wherein filling the trench comprises performing a high density plasma oxide deposition.

16. The method of claim 11 wherein the large tilted angle is from about 10 to about 30 degrees with reference to the Y axis.

17. The method of claim 11 and further comprising forming a P-channel transistor in a region of the substrate adjacent the filled trench.

18. The method of claim 11 wherein implanting fluorine comprises implanting $F_2$ at a dose of from about $5\times10^{12}$ to about $1\times10^{14}$ $cm^2$.

* * * * *